(12) United States Patent
Matic et al.

(10) Patent No.: US 10,965,312 B2
(45) Date of Patent: Mar. 30, 2021

(54) CAPACITANCE-TO-DIGITAL CONVERTER AND ASSOCIATED METHOD HAVING AN EXTENDED MEASUREMENT RANGE

(71) Applicant: Nokia Technologies Oy, Espoo (FI)

(72) Inventors: Tomislav Matic, Osijek (HR); Marijan Herceg, Osijek (HR)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/856,892

(22) Filed: Apr. 23, 2020

(65) Prior Publication Data

US 2020/0350924 A1    Nov. 5, 2020

(30) Foreign Application Priority Data

Apr. 30, 2019   (EP) ..................... 19171878

(51) Int. Cl.
  *H03M 1/12*   (2006.01)
  *H03M 3/00*   (2006.01)
(52) U.S. Cl.
  CPC .................. *H03M 3/458* (2013.01)
(58) Field of Classification Search
  CPC ...... H03M 3/458; H03M 1/802; H03M 1/804; H03M 1/806
  USPC ........................................................ 341/172
  See application file for complete search history.

(56) References Cited

U.S. PATENT DOCUMENTS

| | | | | |
|---|---|---|---|---|
| 4,065,766 A * | 12/1977 | Butler | ................... | H03M 1/508 341/172 |
| 7,598,711 B2 * | 10/2009 | Krah | ..................... | H02J 9/061 320/138 |
| 7,863,908 B2 * | 1/2011 | Wappis | .............. | G01R 19/0092 324/678 |
| 8,416,117 B2 * | 4/2013 | Pedersen | ............ | H03M 1/1215 341/172 |
| 9,628,104 B2 | 4/2017 | Wang et al. | | |

(Continued)

OTHER PUBLICATIONS

Li et al., "A 1 pF-to-10 nF Generic Capacitance-to-Digital Converter Using Zero-Crossing Delta-Sigma Modulation", IEEE Transactions on Circuits and Systems I: Regular Papers, vol. 65, No. 7, Jul. 2018, pp. 2169-2182.

(Continued)

*Primary Examiner* — Jean B Jeanglaude
(74) *Attorney, Agent, or Firm* — Nokia Technologies Oy

(57) ABSTRACT

A capacitance-to-digital converter and an associated method and computer program product are provided that have an extended measurement range. A capacitance-to-digital converter includes first and second capacitors with the second capacitor being configured to measure a change in a value. The capacitance-to-digital converter also includes first and second switches switchably connecting the first and second capacitors, respectively, to a reference voltage while the first and second switches are in a first position such that charge is stored by the first and second capacitors in response to the reference voltage. The capacitance-to-digital converter further includes a saturation detector configured to detect the charge stored by the second capacitor equaling or exceeding the charge stored by the first capacitor and, in response, causing the first and second switches to switch to a second position while continuing to measure the change in the value with the charge stored by the second capacitor.

20 Claims, 7 Drawing Sheets

(56) References Cited

U.S. PATENT DOCUMENTS

| | | | |
|---|---|---|---|
| 9,793,917 B2 | 10/2017 | Dorevitch | |
| 9,825,645 B1 | 11/2017 | Gaggl et al. | |
| 10,263,608 B2* | 4/2019 | Cassagnes | H03F 3/45475 |
| 2007/0114968 A1* | 5/2007 | Krah | H02J 1/10 |
| | | | 320/103 |
| 2007/0171107 A1 | 7/2007 | Wang | |
| 2007/0171108 A1 | 7/2007 | Wang | |
| 2009/0309552 A1* | 12/2009 | Krah | H02J 1/10 |
| | | | 320/140 |
| 2013/0038476 A1* | 2/2013 | Pedersen | H03M 1/1215 |
| | | | 341/110 |
| 2014/0375135 A1 | 12/2014 | Nervegna et al. | |
| 2015/0016175 A1* | 1/2015 | Evans, Jr. | G11C 11/221 |
| | | | 365/145 |
| 2015/0051468 A1 | 2/2015 | Srinivasa et al. | |
| 2016/0196862 A1* | 7/2016 | Evans, Jr. | G11C 11/2275 |
| | | | 365/145 |
| 2016/0301403 A1* | 10/2016 | Cassagnes | H03F 3/45475 |
| 2018/0259364 A1 | 9/2018 | Furubayashi et al. | |

OTHER PUBLICATIONS

Li et al., "A High-Linearity Capacitance-to-Digital Converter Suppressing Charge Errors From Bottom-Plate Switches", IEEE Transactions on Circuits and Systems I: Regular Papers, vol. 61, No. 7, Jul. 2014, pp. 1928-1941.

Jia, "ADI Capacitance-to-Digital Converter Technology in Healthcare Applications", Analog Dialogue, vol. 46, May 2012, pp. 1-3.

Scarlett, "Capacitance-to-Digital Converter Facilitates Level Sensing in Diagnostic Systems", Analog Dialogue, vol. 48, Apr. 2014, pp. 1-3.

Liu, "On-Chip Touch Sensor Readout Circuit Using Passive Sigma-Delta Modulator Capacitance-to-Digital Converter", Thesis, Dec. 2016, 72 pages.

Bingesser et al., "Low-Noise Sigma-Delta Capacitance-to-Digital Converter for Sub-pF Capacitive Sensors with Integrated Dielectric Loss Measurement", Design, Automation and Test in Europe, Mar. 10-14, 2008, 5 pages.

Yang et al., "A Precision Capacitance-to-Digital Converter With 16I-bit ENOB and 7.5-ppm/° C. Thermal Drift", IEEE Journal of Solid-State Circuits, vol. 52, No. 11, Nov. 2017, pp. 3018-3031.

George et al., "Novel Switched-capacitor Dual Slope Capacitance to Digital Converter for Differential Capacitive Sensors", IEEE Instrumentation and Measurement Technology Conference, May 5-7, 2009, 4 pages.

Jung et al., "27.6 A 0.7pF-to-10nF Fully Digital Capacitance-to-Digital Converter Using Iterative Delay-Chain Discharge", IEEE International Solid-State Circuits Conference—(ISSCC) Digest of Technical, Feb. 22-26, 2015, pp. 484-485.

Sanjurjo et al., "A Capacitance-to-Digital Converter for Mems Sensors for Smart Applications", Sensors, vol. 17, 2017, pp. 1-17.

Ismail et al., "A Low-Energy SAR-based Capacitance-to-Digital Converter for Pressure Sensors: System Analysis, Design and Calibration", IEEE 59th International Midwest Symposium on Circuits and Systems (MWSCAS), Oct. 16-19, 2016, 4 pages.

Min et al., "Simplified Structural Textile Respiration Sensor Based on Capacitive Pressure Sensing Method", IEEE Sensors Journal, vol. 14, No. 9, Sep. 2014, pp. 3245-3251.

Fassbender et al., "Fully Implantable Blood Pressure Sensor for Hypertonic Patients", IEEE Sensors, Oct. 26-29, 2008, pp. 1226-1229.

Zadeh et al., "Capacitive Sensing Electrodes. In: CMOS Capacitive Sensors for Lab-on-Chip Applications", Analog Circuits and Signal Processing, 2010, 30 pages.

Mitani et al., "A Compact Perspiration Meter System with Capacitive Humidity Sensor for Wearable Health-Care Applications", Japanese Journal of Applied Physics, vol. 57, No. 4s, 2018, 8 pages.

Extended European Search Report received for corresponding European Patent Application No. 19171878.2, dated Nov. 25, 2019, 6 pages.

Condo et al., "A Switched-Capacitor Interface for Capacitive Sensors with Wide Dynamic Range", IEEE Transactions on Instrumentation and Measurement, vol. 38, No. 3, Jun 1989, pp. 736-739.

* cited by examiner

CAPACITANCE-TO-DIGITAL CONVERTER AND ASSOCIATED METHOD HAVING AN EXTENDED MEASUREMENT RANGE

TECHNOLOGICAL FIELD

An example embodiment relates generally to a capacitance-to-digital converter and associated method and computer program product for measuring a change in a value and, more particularly, to a capacitance-to-digital converter and associated method and computer program product configured to provide an extended measurement range for a change in a value, such as a change in a physical value.

BACKGROUND

Sensors are widely utilized in order to measure a variety of different values, such as a variety of different physical values. For example, micro-electromechanical systems (MEMS) capacitive sensors are utilized in a variety of applications, such as biomedical applications including blood flow analysis and deoxyribonucleic acid (DNA) sensing, as well as in accelerometers, pressure sensors and the like that are incorporated into various devices, such as smartphones, wearable devices, automotive systems, etc., as a result of their relatively high sensitivity, relatively low power consumption and relatively low temperature drift. Of the MEMS capacitive sensors, capacitance-to-digital converters are also increasingly being utilized such as in biomedical applications including as connectivity detectors between the human body and electrodes, such as for sweat detection, respiratory rate measurement and/or blood pressure measurement.

However, MEMS capacitive sensors generally have a limited sensing range, such as between 18 and 36 picofarads (pF) for pressure sensing or between 0.33 and 10 nanofarads (nF) for DNA sensing. Due to the relatively narrow measurement range, MEMS capacitive sensors may include parallel distributed measurement sensing that incorporates multiple read-out circuits to provide a wider measurement range. Such parallel distributed measurement sensing increases the complexity of the capacitance-to-digital converter and potentially increases the cost and/or size of the capacitance-to-digital converter.

As a result of the limited measurement range of a MEMS capacitance sensor, sigma-delta switching schemes have also been utilized in conjunction with capacitance-to-digital converters. Sigma-delta based capacitance-to-digital converters utilize charge balancing between reference and sensing capacitors to provide an estimation of the charge stored by the sensing capacitor that, in turn, is representative of a value to be measured. In this regard, the mean value of the output voltage of a sigma-delta based capacitance-to-digital converter is proportional to the capacitance ratio of the sensing and reference capacitors. However, sigma-delta based capacitance-to-digital converters are also limited in that the maximum capacitance that can be measured is limited by the size of the reference capacitor. Thus, upon the capacitance of the sensing capacitor equaling the capacitance of the reference capacitor, the sigma-delta based capacitance-to-digital converter saturates and is unable to measure further changes in the value being measured that serve to further increase the capacitance of the sensing capacitor, thereby limiting the utility of sigma-delta based capacitance-to-digital converters.

As the measurement range of a sigma-delta based capacitance-to-digital converter is limited by the size of the reference capacitor, a sigma-delta based capacitance-to-digital converter could be developed having a larger reference capacitor and, as a result, a correspondingly larger measurement range. However, increases in the size of the reference capacitor generally correspondingly increase the size of the sigma-delta based capacitance-to-digital converter and the cost of the sigma-delta based capacitance-to-digital converter. In this regard, a sigma-delta based capacitance-to-digital converter may be embodied by an integrated circuit (IC) which includes, among other components, the reference capacitor such that increases in the size of the reference capacitor may disadvantageously also increase the size and cost of the IC.

BRIEF SUMMARY

A capacitance-to-digital converter and an associated method and computer program product are provided that have an extended measurement range. In this regard, the capacitance-to-digital converter and the associated method and computer program product are configured to effectively switch or reverse the manner in which the sensing and reference capacitors are electrically connected within the capacitance-to-digital converter upon saturation of the capacitance-to-digital converter in order to extend the measurement range, such as by doubling the measurement range. By extending the measurement range while maintaining the relatively high resolution and linearity of the capacitance-to-digital converter, the capacitance-to-digital converter and the associated method and computer program product of an example embodiment may provide improved performance and may be qualified for use in conjunction with additional applications that demand a wider measurement range. Alternatively, the size of the reference capacitor may be reduced while permitting the capacitance-to-digital converter to provide the same measurement range, thereby reducing the size and, in some instances, the cost of the capacitance-to-digital converter.

In an example embodiment, a method is provided that includes storing charge with first and second capacitors of a capacitance-to-digital converter while first and second switches are in a first position so as to connect the first and second capacitors, respectively, with a reference voltage. The method also includes measuring a change in charge stored by the second capacitor. The change in charge is representative of a corresponding change in a value. The method further includes detecting the charge stored by the second capacitor equaling or exceeding the charge stored by the first capacitor. In response to detecting the charge stored by the second capacitor equaling or exceeding the charge stored by the first capacitor, the method further includes causing the first and second switches to switch to a second position while continuing to measure the change in the charge stored by the second capacitor as representative of the corresponding change in the value.

The method of an example embodiment also includes differently determining a measure of the value depending upon whether the first and second switches are in the first or second position. In this example embodiment, the method may differently determine the measure of the value by determining the measure of the value based upon a ratio of the charge stored by the second capacitor to the charge stored by the first capacitor in an instance in which the first and second switches are in the first position and determining the measure of the value based upon a ratio of the charge stored by the first capacitor to the charge stored by the second capacitor in an instance in which the first and second switches are in the second position.

The method of an example embodiment also includes detecting, while the first and second switches are in the second position, the charge stored by the first capacitor equaling or exceeding the charge stored by the second capacitor and, in response to detecting the charge stored by the first capacitor equaling or exceeding the charge stored by the second capacitor, causing the first and second switches to switch to the first position while continuing to measure the change in the charge stored by the second capacitor as representative of the corresponding change in the value. In an example embodiment, the method detects the charge stored by the second capacitor equaling or exceeding the charge stored by the first capacitor by detecting an output of the capacitance-to-digital converter being in saturation.

The method of an example embodiment may further include, while the first and second switches are in the first position, switchably connecting the first capacitor to the reference voltage with a third switch and switchably connecting the second capacitor to the reference voltage with a fourth switch and, while the first and second switches are in the second position, switchably connecting the second capacitor to the reference voltage with the third switch and switchably connecting the first capacitor to the reference voltage with the fourth switch. In this example embodiment, the method may also include switchably connecting the first and second capacitors to an amplifier such that, while an output of the amplifier is negative, the output of the amplifier is increased based upon the charge stored by a respective one of the first and second capacitors that is connected to the reference voltage by the fourth switch and independent of the charge stored by a respective one of the first and second capacitors that is connected to the reference voltage by the third switch and, while the output of the amplifier is positive, the output of the amplifier is decreased based upon a difference between the charges stored by the first and second capacitors. The method of this example embodiment may also include generating the output of the capacitance-to-digital converter in the form of a digital signal based upon the output of the amplifier and determining a measure of the value based upon a ratio of a number of clock cycles having a predefined value to a total number of clock cycles within a measurement period. The method of this example embodiment may also detect the charge stored by the second capacitor equaling or exceeding the charge stored by the first capacitor by detecting the output of the capacitance-to-digital converter being in saturation in an instance in which the digital signal has the predefined value throughout the measurement period.

In another example embodiment, an apparatus is provided that includes means for storing charge with first and second capacitors of a capacitance-to-digital converter while first and second switches are in a first position so as to connect the first and second capacitors, respectively, with a reference voltage. The apparatus also includes means for measuring a change in a value with a corresponding change in charge stored by the second capacitor and means for detecting the charge stored by the second capacitor equaling or exceeding the charge stored by the first capacitor. In response to detecting the charge stored by the second capacitor equaling or exceeding the charge stored by the first capacitor, the apparatus further includes means for causing the first and second switches to switch to a second position while continuing to measure the change in the value with the charge stored by the second capacitor.

The apparatus of an example embodiment also includes means for differently determining a measure of the value depending upon whether the first and second switches are in the first or second position. In this example embodiment, the means for differently determining the measure of the value may include means for determining the measure of the value based upon a ratio of the charge stored by the second capacitor to the charge stored by the first capacitor in an instance in which the first and second switches are in the first position and means for determining the measure of the value based upon a ratio of the charge stored by the first capacitor to the charge stored by the second capacitor in an instance in which the first and second switches are in the second position.

The apparatus of an example embodiment also includes means for detecting, while the first and second switches are in the second position, the charge stored by the first capacitor equaling or exceeding the charge stored by the second capacitor and means, in response to detecting the charge stored by the first capacitor equaling or exceeding the charge stored by the second capacitor, for causing the first and second switches to switch to the first position while continuing to measure the change in the value with the charge stored by the second capacitor. In an example embodiment, the means for detecting the charge stored by the second capacitor equaling or exceeding the charge stored by the first capacitor includes means for detecting an output of the capacitance-to-digital converter being in saturation.

The apparatus of an example embodiment may further include means, while the first and second switches are in the first position, for switchably connecting the first capacitor to the reference voltage with a third switch and for switchably connecting the second capacitor to the reference voltage with a fourth switch and means, while the first and second switches are in the second position, for switchably connecting the second capacitor to the reference voltage with the third switch and for switchably connecting the first capacitor to the reference voltage with the fourth switch. In this example embodiment, the apparatus may also include means for switchably connecting the first and second capacitors to an amplifier such that, while an output of the amplifier is negative, the output of the amplifier is increased based upon the charge stored by a respective one of the first and second capacitors that is connected to the reference voltage by the fourth switch and independent of the charge stored by a respective one of the first and second capacitors that is connected to the reference voltage by the third switch and, while the output of the amplifier is positive, the output of the amplifier is decreased based upon a difference between the charges stored by the first and second capacitors. The apparatus of this example embodiment may also include means for generating the output of the capacitance-to-digital converter in the form of a digital signal based upon the output of the amplifier and means for determining a measure of the value based upon a ratio of a number of clock cycles having a predefined value to a total number of clock cycles within a measurement period. In this example embodiment, the means for detecting the charge stored by the second capacitor equaling or exceeding the charge stored by the first capacitor may include means for detecting the output of the capacitance-to-digital converter being in saturation in an instance in which the digital signal has the predefined value throughout the measurement period.

In an example embodiment, a capacitance-to-digital converter is provided that includes first and second capacitors. The second capacitor is configured to measure a change in charge stored by the second capacitor. The change in charge is representative of a corresponding change in a value. The capacitance-to-digital converter also includes first and second switches switchably connecting the first and second capacitors, respectively, to a reference voltage while the first and second switches are in a first position such that charge is stored by the first and second capacitors in response to the reference voltage. The capacitance-to-digital converter further includes a saturation detector configured to detect the charge stored by the second capacitor equaling or exceeding the charge stored by the first capacitor and, in response to detecting the charge stored by the second capacitor equaling or exceeding the charge stored by the first capacitor, causing the first and second switches to switch to a second position while continuing to measure the change in the value with the charge stored by the second capacitor.

The capacitance-to-digital converter of an example embodiment may also include a processor configured to differently determine a measure of the value depending upon whether the first and second switches are in the first or second position. For example, the processor of an example embodiment is configured to determine a measure of the value based upon a ratio of the charge stored by the second capacitor to the charge stored by the first capacitor in an instance in which the first and second switches are in the first position and to determine the measure of the value based upon a ratio of the charge stored by the first capacitor to the charge stored by the second capacitor in an instance in which the first and second switches are in the second position. In an example embodiment, the capacitance-to-digital converter also includes third and fourth switches that are configured, while the first and second switches are in the first position, to switchably connect the first capacitor to the reference voltage with the third switch and to switchably connect the second capacitor to the input voltage with the fourth switch. While the first and second switches are in the second position, the third and further switches of this example embodiment are also configured to switchably connect the second capacitor to the reference voltage with the third switch and to switchably connect the first capacitor to the input voltage with the fourth switch.

The capacitance-to-digital converter of an example embodiment also includes an amplifier to which the first and second capacitors are switchably connected. In this example embodiment, while an output of the amplifier is negative, the output of the amplifier is increased based upon the charge stored by a respective one of the first and second capacitors that is connected to the reference voltage by the fourth switch and independent of the charge stored by a respective one of the first and second capacitors that is connected to the reference voltage by the third switch. In addition, while the output of the amplifier is positive, the output of the amplifier of this example embodiment is decreased based upon a difference between the charges stored by the first and second capacitors. The capacitance-to-digital converter of this example embodiment may also include a latch circuit configured to generate the output of the capacitance-to-digital converter in the form of a digital signal based upon the output of the amplifier. The capacitance-to-digital converter of this example embodiment may further include a processor configured to determine a measure of the value based upon a ratio of a number of clock cycles having a predefined value to a total number of clock cycles within a measurement period. The saturation detector of an example embodiment is configured to detect the charge stored by the second capacitor equaling or exceeding the charge stored by the first capacitor by being configured to detect an output of the capacitance-to-digital converter being in saturation, such as in an instance in which the digital signal has the predefined value throughout the measurement period.

The saturation detector of an example embodiment is also configured to detect, while the first and second switches are in the second position, the charge stored by the first capacitor equaling or exceeding the charge stored by the second capacitor. In response to detecting the charge stored by the first capacitor equaling or exceeding the charge stored by the second capacitor, the saturation detector of this example embodiment is further configured to cause the first and second switches to switch to the first position while continuing to store charge with the first and second capacitors.

In another example embodiment, a capacitance-to-digital converter is provided that includes first and second capacitors. The second capacitor is configured to measure a change in a value as represented by a corresponding change in a charge stored by the second capacitor. The capacitance-to-digital converter also includes first and second switches switchably connecting the first and second capacitors, respectively, to a reference voltage while the first and second switches are in a first position such that charge is stored by the first and second capacitors in response to the reference voltage. The capacitance-to-digital converter further includes means for detecting the charge stored by the second capacitor equaling or exceeding the charge stored by the first capacitor and means, in response to detecting the charge stored by the second capacitor equaling or exceeding the charge stored by the first capacitor, for causing the first and second switches to switch to a second position while continuing to measure the change in the value with the charge stored by the second capacitor.

The capacitance-to-digital converter of an example embodiment may also include means for differently determining a measure of the input voltage depending upon whether the first and second switches are in the first or second position. For example, the capacitance-to-digital converter of an example embodiment may include means for determining a measure of the value based upon a ratio of the charge stored by the second capacitor to the charge stored by the first capacitor in an instance in which the first and second switches are in the first position and means for determining the measure of the value based upon a ratio of the charge stored by the first capacitor to the charge stored by the second capacitor in an instance in which the first and second switches are in the second position. In an example embodiment, the capacitance-to-digital converter also includes third and fourth switches and means for controlling the third and fourth switches such that, while the first and second switches are in the first position, the first capacitor is switchably connected to the reference voltage with the third switch and the second capacitor is switchably connected to the input voltage with the fourth switch. While the first and second switches are in the second position, means for controlling the third and further switches switchably connect the second capacitor to the reference voltage with the third switch and to switchably connect the first capacitor to the input voltage with the fourth switch.

The capacitance-to-digital converter of an example embodiment also includes means for switchably connecting the first and second capacitors to an amplifier. In this example embodiment, while an output of the amplifier is negative, the amplifier includes means for increasing its output based upon the charge stored by a respective one of the first and second capacitors that is connected to the reference voltage by the fourth switch and independent of the charge stored by a respective one of the first and second capacitors that is connected to the reference voltage by the third switch. In addition, while the output of the amplifier is positive, the amplifier of this example embodiment includes means for decreasing its output based upon a difference between the charges stored by the first and second capacitors. The capacitance-to-digital converter of this example embodiment may also include means for generating the output of the capacitance-to-digital converter in the form of a digital signal based upon the output of the amplifier. The capacitance-to-digital converter of this example embodiment may further include means for determining a measure of the value based upon a ratio of a number of clock cycles having a predefined value to a total number of clock cycles within a measurement period. The means for detecting the charge stored by the second capacitor equaling or exceeding the charge stored by the first capacitor may include means for detecting an output of the capacitance-to-digital converter being in saturation, such as in an instance in which the digital signal has the predefined value throughout the measurement period.

The means for detecting the charge stored by the second capacitor equaling or exceeding the charge stored by the first capacitor may include means for detecting, while the first and second switches are in the second position, the charge stored by the first capacitor equaling or exceeding the charge stored by the second capacitor. In response to detecting the charge stored by the first capacitor equaling or exceeding the charge stored by the second capacitor, the means for detecting the charge stored by the second capacitor equaling or exceeding the charge stored by the first capacitor includes means for causing the first and second switches to switch to the first position while continuing to store charge with the first and second capacitors.

In an example embodiment, a computer program product is provided that is configured to control a capacitance-to-digital converter that includes first and second capacitors switchably connected to a reference voltage with first and second switches, respectively, that are in a first position. The second capacitor is configured to measure a change in a value with a corresponding change in charge stored by the second capacitor. The capacitance-to-digital converter further includes a saturation detector configured to detect a charge stored by the second capacitor equaling or exceeding a charge stored by the first capacitor. In this example embodiment, the computer program product includes at least one non-transitory computer-readable storage medium having computer-executable program code instructions stored therein with the computer-executable program code instructions including program code instructions configured to control the first and second switches to switch to a second position, different than the first position, in response to detecting that the charge stored by the second capacitor equals or exceeds the charge stored by the first capacitor.

The computer-executable program code instructions of an example embodiment also include program code instructions configured to determine a measure of the value based upon a ratio of the charge stored by the second capacitor to the charge stored by the first capacitor in an instance in which the first and second switches are in the first position. The computer-executable program code instructions of this example embodiment further include program code instructions configured to determine the measure of the value based upon a ratio of the charge stored by the first capacitor to the charge stored by the second capacitor in an instance in which the first and second switches are in the second position. In an example embodiment, the computer-executable program code instructions also include program code instructions configured to control third and fourth switches of the capacitance-to-digital converter such that while the first and second switches are in the first position, the first capacitor is switchably connected to the reference voltage with the third switch and the second capacitor is switchably connected to the reference voltage with the fourth switch and also such while the first and second switches are in the second position, the second capacitor is switchably connected to the reference voltage with the third switch and the first capacitor is switchably connected to the reference voltage with the fourth switch.

In another example embodiment, an apparatus is provided that is configured to control a capacitance-to-digital converter that includes first and second capacitors switchably connected to a reference voltage with first and second switches, respectively, that are in a first position. The second capacitor is configured to measure a change in a value with a corresponding change in charge stored by the second capacitor. The capacitance-to-digital converter further includes a saturation detector configured to detect a charge stored by the second capacitor equaling or exceeding a charge stored by the first capacitor. In this example embodiment, the apparatus includes means for controlling the first and second switches to switch to a second position, different than the first position, in response to detecting that the charge stored by the second capacitor equals or exceeds the charge stored by the first capacitor.

The apparatus of an example embodiment also includes means for determining a measure of the value based upon a ratio of the charge stored by the second capacitor to the charge stored by the first capacitor in an instance in which the first and second switches are in the first position. The apparatus of this example embodiment further include means for determining the measure of the value based upon a ratio of the charge stored by the first capacitor to the charge stored by the second capacitor in an instance in which the first and second switches are in the second position. In an example embodiment, the apparatus also includes means for controlling third and fourth switches of the capacitance-to-digital converter such that while the first and second switches are in the first position, the first capacitor is switchably connected to the reference voltage with the third switch and the second capacitor is switchably connected to the reference voltage with the fourth switch and also such while the first and second switches are in the second position, the second capacitor is switchably connected to the reference voltage with the third switch and the first capacitor is switchably connected to the reference voltage with the fourth switch.

BRIEF DESCRIPTION OF THE DRAWINGS

Figure 1:
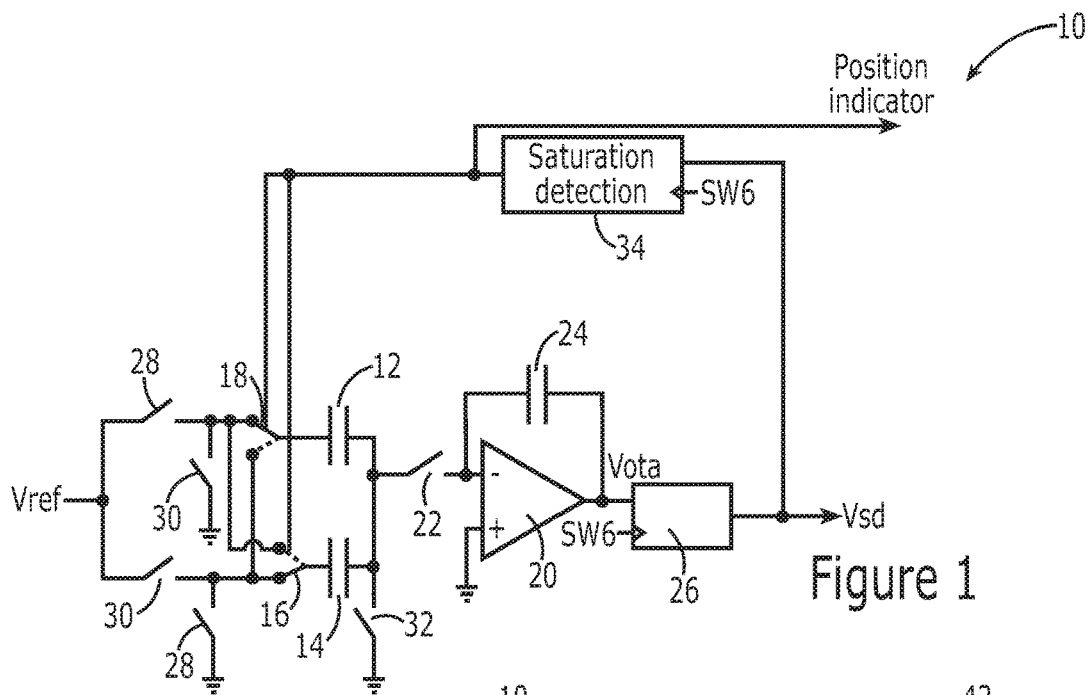
Figure 2:
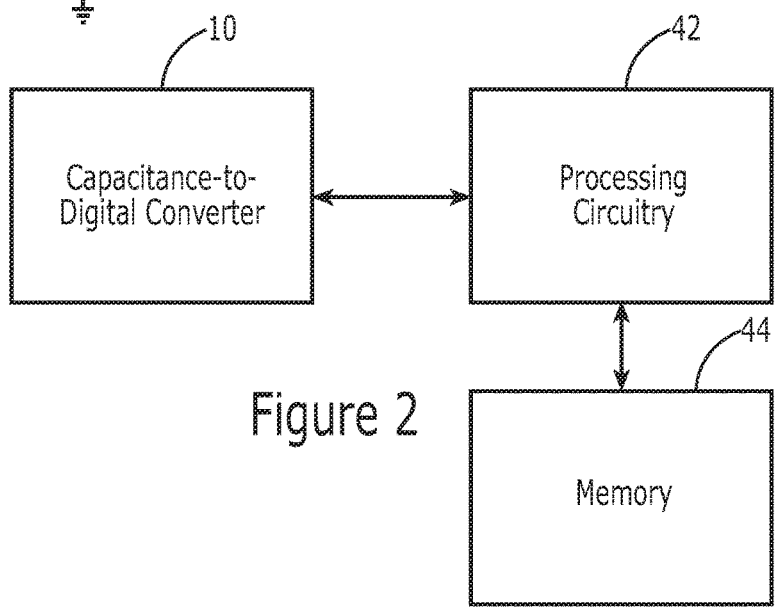
Figure 3:
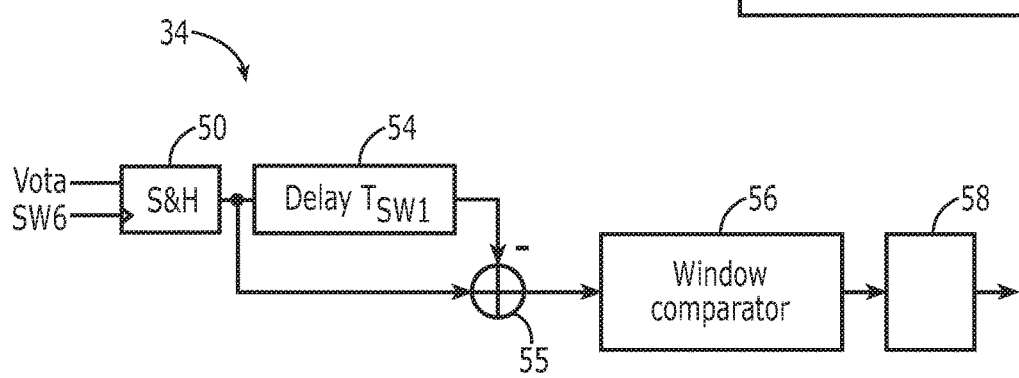
Figure 4:
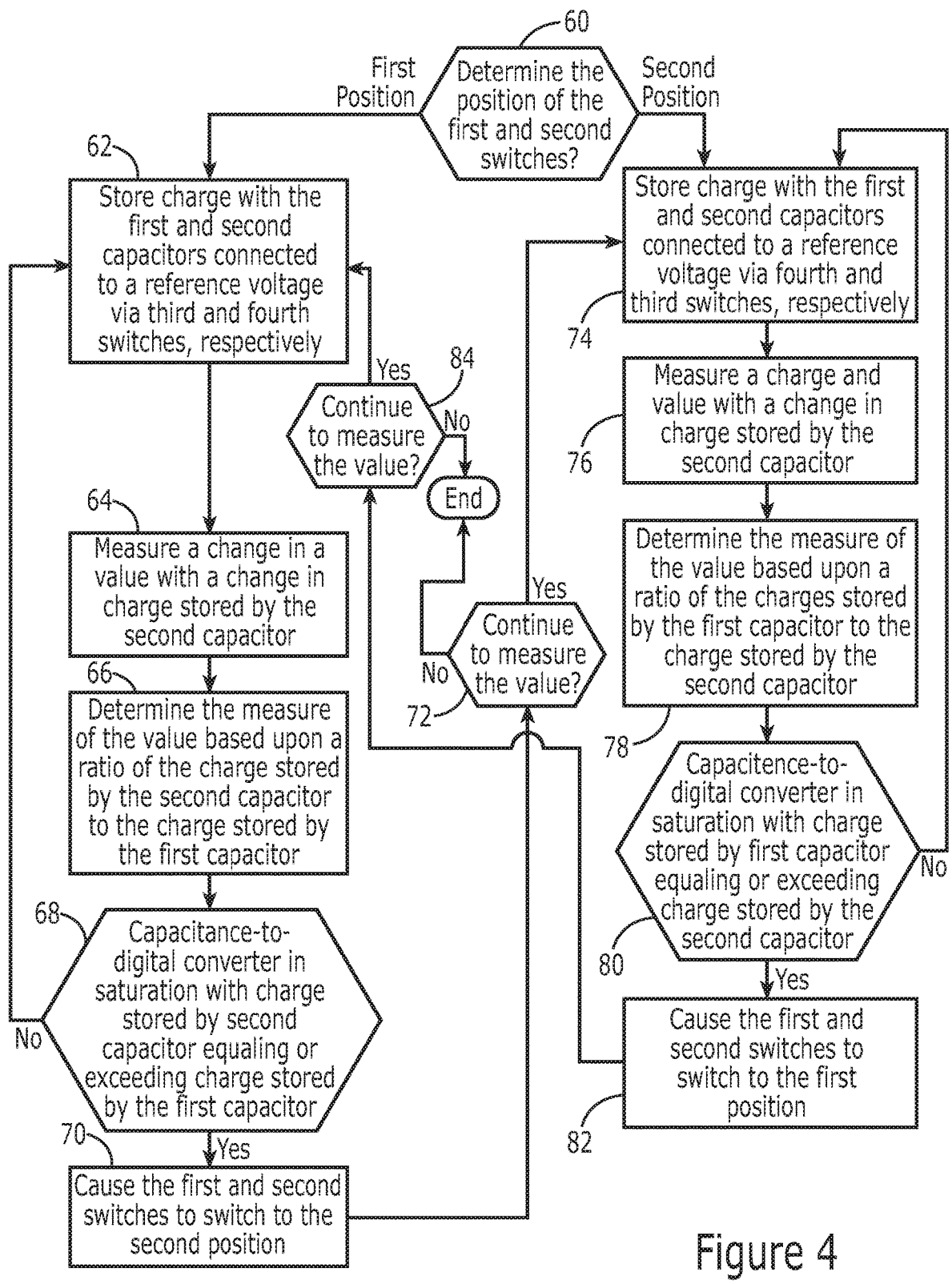
Figure 5:
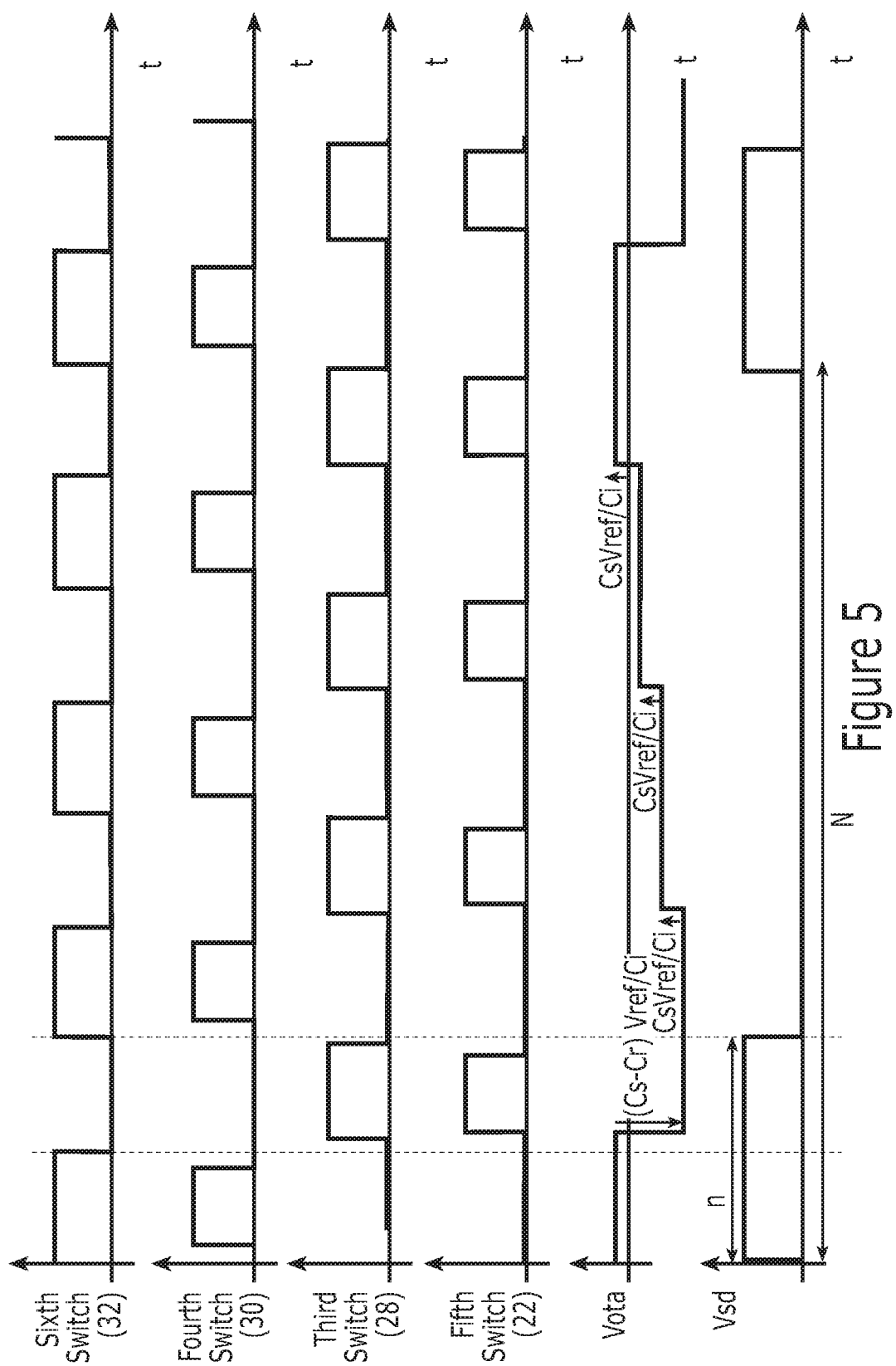
Figure 6:
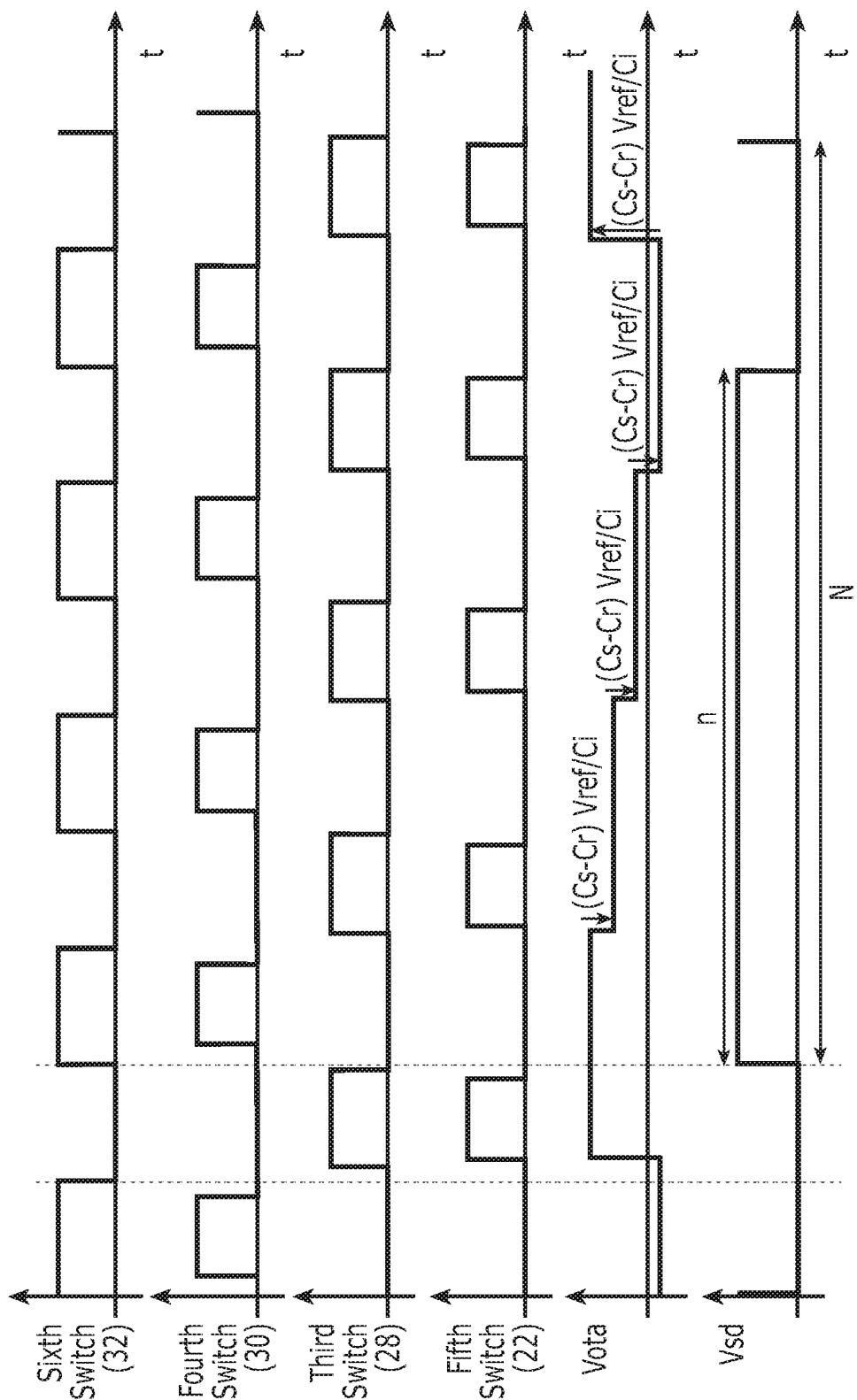
Figure 7:
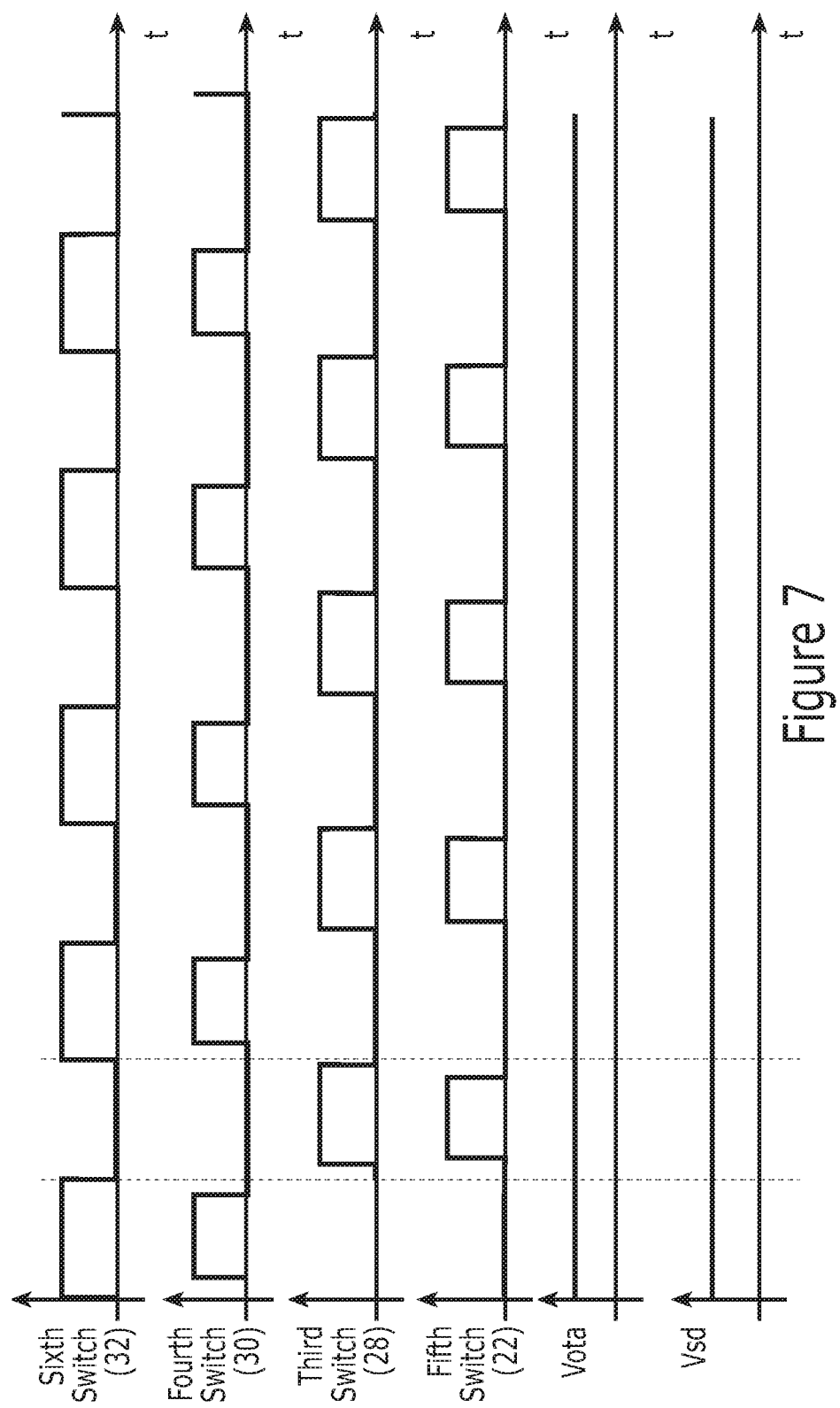
Figure 8:
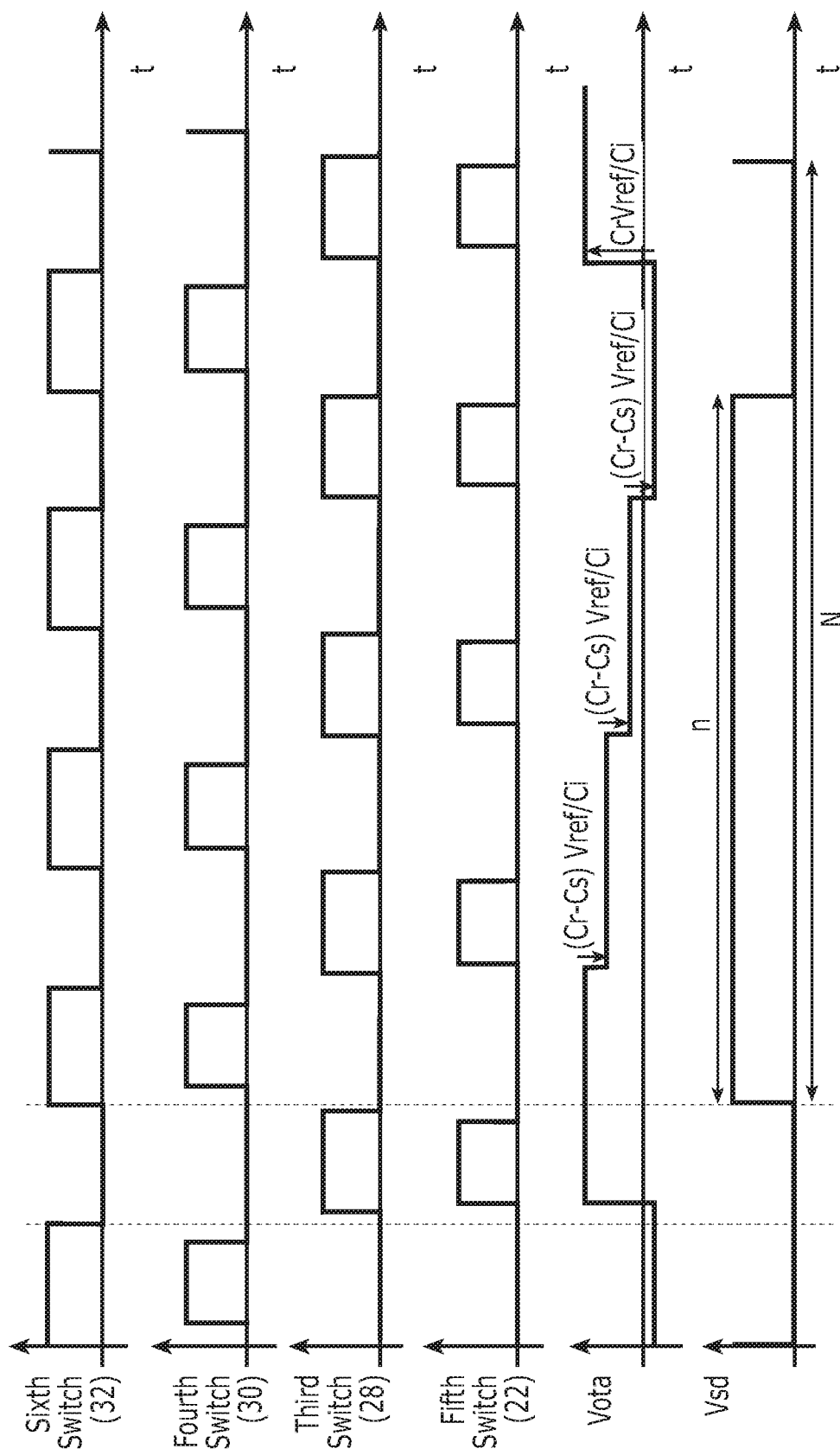
Figure 9A:
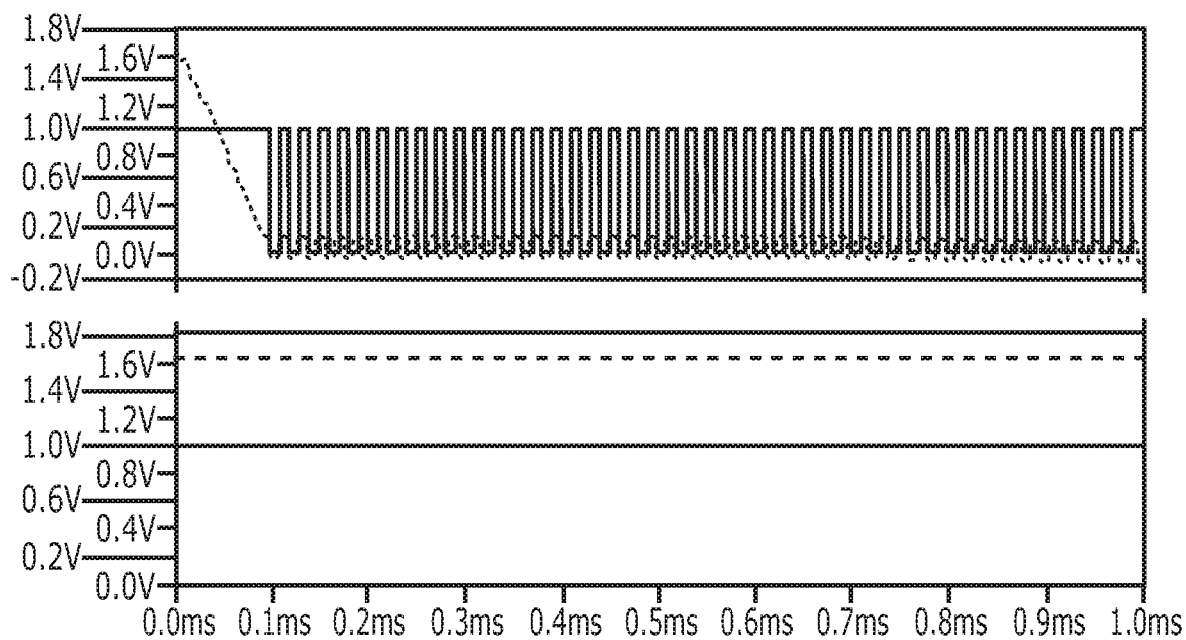
Figure 9B:
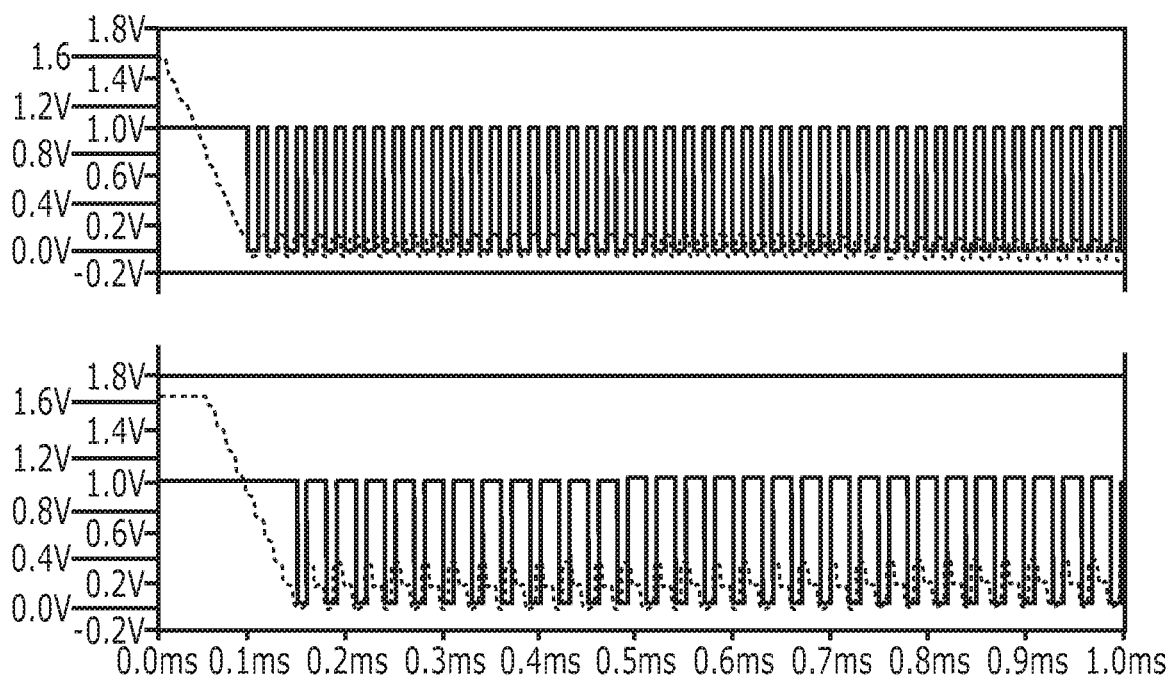

Having thus described certain example embodiments of the present disclosure in general terms, reference will hereinafter be made to the accompanying drawings, which are not necessarily drawn to scale, and wherein:

FIG. 1 is a circuit diagram of a capacitance-to-digital converter in accordance with an example embodiment;

FIG. 2 is a block diagram of a capacitance-to-digital converter system including a capacitance-to-digital converter in accordance with an example embodiment of the present disclosure;

FIG. 3 is a block diagram illustrating saturation detection circuitry in accordance with an example embodiment to the present disclosure;

FIG. 4 is a flow chart illustrating operations performed, such as by the capacitance-to-digital converter system of FIG. 2, in order to measure a value utilizing a capacitanceto-digital converter in in accordance with an example embodiment of the present disclosure;

FIG. 5 is a timing diagram of an embodiment in which the capacitance Cs of the sensing capacitor and the capacitance Cr of the reference capacitor are defined as Cs=Cr/4 in accordance with an example embodiment of the present disclosure;

FIG. 6 is a timing diagram of an embodiment in which the capacitance Cs of the sensing capacitor and the capacitance Cr of the reference capacitor are defined as Cs=3Cr/4 in accordance with an example embodiment of the present disclosure;

FIG. 7 is a timing diagram of an embodiment in which the capacitance Cs of the sensing capacitor and the capacitance Cr of the reference capacitor are defined as Cs≥Cr such that the capacitor-to-digital converter is saturated in accordance with an example embodiment of the present disclosure;

FIG. 8 is a timing diagram of an embodiment in which the capacitance Cr of the reference capacitor and the capacitance Cs of the sensing capacitor are defined as Cr=3Cs/4 after having switched or reversed the manner in which the sensing and reference capacitors are electrically connected within the capacitance-to-digital converter upon saturation of the capacitance-to-digital converter in accordance with an example embodiment of the present disclosure;

FIG. 9A illustrates the waveforms output by the amplifier and a flip flop of a conventional sigma-delta based capacitance-to-digital converter; and FIG. 9B illustrates the waveforms output by the amplifier and the latch, such as a flip flop, of a capacitance-to-digital converter in accordance with an example embodiment to the present disclosure.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device (such as a core network apparatus), field programmable gate array, and/or other computing device.

A capacitance-to-digital converter, such as a sigma-delta based capacitance-to-digital converter, and an associated method and computer program product are provided in order to measure a value, such as a physical value. Capacitance-to-digital converters may be utilized in a variety of applications as a result of their high sensitivity, low power consumption and low temperature drift. For example, capacitance-to-digital converters may be utilized by accelerometers or pressure sensors, such as for smartphones, wearable devices, automotive systems and many other devices. Capacitance-to-digital converters may also be utilized in conjunction with biomedical applications, such as for blood flow analysis, DNA sensing and the like. For example, capacitance-to-digital converters are increasingly being utilized by connectivity detectors between the human body and electrodes, such as for sweat detection, respiratory rate measurement, blood pressure measurement or the like.

The capacitance-to-digital converter as well as the associated method and computer program product of an example embodiment provide for an extended measurement range in comparison to conventional capacitance-to-digital converters including conventional sigma-delta based capacitance-to-digital converters that can saturate and correspondingly limit the measurement range. As described below, the capacitance-to-digital converter and associated method and computer program product are configured to dynamically switch or reverse the manner in which the sensing and reference capacitors are electrically connected within the capacitance-to-digital converter upon saturation of the capacitance-to-digital converter in order to extend the measurement range, such as by doubling the measurement range. As a result of the extended measurement range, the capacitance-to-digital converter and the associated method and computer program product may offer improved performance in terms of the range of values that may be reliably measured, while continuing to provide high sensitivity, low power consumption and low temperature drift. Additionally, the enhanced measurement range provided by the capacitance-to-digital converter and the associated method and computer program product of an example embodiment may permit the capacitance-to-digital converter to be utilized in conjunction with additional applications that require an extended measurement range. Alternatively, the size of the reference capacitor may be reduced while permitting the capacitance-to-digital converter to provide the same measurement range, thereby reducing the size and, in some instances, the cost of the capacitance-to-digital converter.

Referring now to FIG. 1, a capacitance-to-digital converter 10, such as a sigma-delta based capacitance-to-digital converter, in accordance with an example embodiment is depicted. As shown, the capacitance-to-digital converter includes a reference capacitor 12 and a sensing capacitor 14, termed first and second capacitors, respectively. In an example embodiment in which the capacitance-to-digital converter is at least partly embodied by an integrated circuit, the first capacitor is included within the integrated circuit and, as a result, has a fixed size, while the second capacitor is external to the integrated circuit, but is electrically connected thereto. The second capacitor is configured to measure a value, such as a physical value, with the charge stored by the second capacitor being dependent upon the value being measured.

Sigma-delta based capacitance-to-digital converters utilize charge balancing to provide an estimation of the capacitance of the sensing capacitor and, as a result, to determine the value being measured. In this regard, sigma-delta based capacitance-to-digital converters provide for charge balancing between the capacitance of the sensing capacitor and the capacitance of the reference capacitor. As a result, the output of the sigma-delta based capacitance-to-digital converter, such as the mean value of the output, is proportional to a ratio of the capacitance of the sensing capacitor and the capacitance of the reference capacitor.

With reference to the capacitance-to-digital converter 10 of FIG. 1, a reference voltage Vref, such as a fixed predefined voltage, is provided to the capacitance-to-digital converter. The reference voltage is applied to the first and second capacitors 12, 14, that is, the reference capacitor and the sensing capacitor, respectively, by first and second switches 16, 18, respectively. In addition to the first and second switches, the capacitance-to-digital converter also includes a plurality of other switches that controllably and switchably connect the reference voltage to the first and second capacitors in the manner described below.

The capacitance-to-digital converter 10 of an example embodiment also includes an amplifier 20, such as an operational transconductance amplifier, that is switchably connected, switches by a fifth switch 22, to the first and second capacitors 12, 14. The amplifier includes a feedback capacitor 24 with the amplifier being switchably connected to the first and second capacitors such that the feedback capacitor receives a charge Q transferred from the first and second capacitors in a manner described below that is dependent upon the position of the plurality of the switches of the capacitance-to-digital converter.

In an example embodiment, the capacitance-to-digital converter 10 optionally includes means, such as a latch circuit (referenced herein as a latch) as may be embodied by a flip flop 26, e.g., a D-type flip flop, for converting the output Vota of the amplifier 20 to a digital signal Vsd, such as a digital word. By way of example, but not of limitation, latch will be hereinafter described in conjunction with an example embodiment in which the latch is a flip flop 26. However, the latch may be differently implemented in other embodiments. In an example embodiment, the flip flop is configured to output a first value, such as a logical 1, and to output a second value, dependent upon the polarity of the output of the amplifier. Based upon the output of the amplifier and, in turn, the output of the flip flop, the value, such as the physical value, measured by the second capacitor 14 may be determined as described below.

In the example embodiment of FIG. 1, the capacitance-to-digital converter 10 also includes or is otherwise associated with means, such as a saturation detector 34, for detecting instances in which the capacitance-to-digital converter is saturated and, in response, for causing the first and second capacitors 12, 14, that is, the reference and sensing capacitors, to be dynamically switched or reversed in terms of the manner in which the first and second capacitors are electrically connected, such as by repositioning the first and second switches 16, 18 to a different position, that is, a second position. For example, the capacitance-to-digital converter of FIG. 1 depicts the first and second switches in a first position. In the first position, the first capacitor, that is, the reference capacitor, is switchably connected to the reference voltage via a third switch 28, while the second capacitor, that is, the sensing capacitor, is switchably connected to the reference voltage via a fourth switch 30. Upon detecting that the capacitance-to-digital converter is saturated, the first and second switches may be repositioned to the second position as shown in dashed lines in FIG. 1 in which the first capacitor, that is, the reference capacitor, is connected to the reference voltage via the fourth switch, while the second capacitor, that is, the sensing capacitor, is connected to the reference voltage by the third switch.

The output of the flip flop 26 is based on a ratio of the capacitance of the second capacitor 14 and the capacitance of the first capacitor 12 with the output of the flip flop and, more particularly, the mean value of the output of the flip flop, being representative of the value measured by the second capacitor. In this regard, while in the first position, the mean value of the output of the flip flop is defined to equal the ratio of the capacitance of the second capacitor relative to the capacitance of the first capacitor. Following the transition of the first and second switches 16, 18 to the second position, the output of the flip flop is differently defined. For example, while the first and second switches are in the second position, the mean value of the output of the flip flop is defined to equal the ratio of the capacitance of the first capacitor to the capacitance of the second capacitor. Regardless of the position of the first and second switches, the output of the flip flop and, more particularly, the mean value of the output of the flip flop defines a measure of the value measured by the second capacitor. As a result of the different manners in which the output of the flip flop is defined and, in turn, the measure of value is determined, however, the measurement range of the capacitance-to-digital converter is effectively extended.

With reference now to the capacitance-to-digital converter system 40 of FIG. 2, the capacitance-to-digital converter 10 of an example embodiment may be controlled by an apparatus that includes, is associated with or is otherwise in communication with processing circuitry 42 and at least one memory 44. The processing circuitry may be in communication with the memory device via a bus for passing information among components of the apparatus. The memory device may be non-transitory and may include, for example, one or more volatile and/or non-volatile memories. In other words, for example, the memory device may be an electronic storage device (e.g., a computer readable storage medium) comprising gates configured to store data (e.g., bits) that may be retrievable by a machine (e.g., a computing device like the processing circuitry). The memory device may be configured to store information, data, content, applications, instructions, or the like for enabling the apparatus to carry out various functions in accordance with an example embodiment of the present disclosure. For example, the memory device could be configured to buffer input data for processing by the processing circuitry. Additionally, or alternatively, the memory device could be configured to store instructions for execution by the processing circuitry.

The apparatus may, in some embodiments, be embodied in various computing devices, e.g., a computer. However, in some embodiments, the apparatus may be embodied as a chip or chip set. In other words, the apparatus may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon. The apparatus may therefore, in some cases, be configured to implement an embodiment of the present invention on a single chip or as a single "system on a chip."

As such, in some cases, a chip or chipset may constitute means for performing one or more operations for providing the functionalities described herein.

The processing circuitry 42 may be embodied in a number of different ways. For example, the processing circuitry may be embodied as one or more of various hardware processing means such as one or more processors, coprocessors, microprocessors, controllers, digital signal processors (DSP), processing elements with or without an accompanying DSP, or various other circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processing circuitry may include one or more processing cores configured to perform independently. A multi-core processing circuitry may enable multiprocessing within a single physical package. Additionally, or alternatively, the processing circuitry may include one or more processors configured in tandem via the bus to enable independent execution of instructions, pipelining and/or multithreading.

In an example embodiment, the processing circuitry 42 may be configured to execute instructions stored in the memory device 44 or otherwise accessible to the processing circuitry. Alternatively, or additionally, the processing circuitry may be configured to execute hard coded functionality. As such, whether configured by hardware or software methods, or by a combination thereof, the processing circuitry may represent an entity (e.g., physically embodied in circuitry) capable of performing operations according to an embodiment of the present disclosure while configured accordingly. Thus, for example, when the processing circuitry is embodied as an ASIC, FPGA or the like, the processing circuitry may be specifically configured hardware for conducting the operations described herein. Alternatively, as another example, when the processing circuitry is embodied as an executor of instructions, the instructions may specifically configure the processor to perform the algorithms and/or operations described herein when the instructions are executed. However, in some cases, the processing circuitry may be a processor of a specific device (e.g., an image or video processing system) configured to employ an embodiment of the present invention by further configuration of the processing circuitry by instructions for performing the algorithms and/or operations described herein. The processing circuitry may include, among other things, a clock, an arithmetic logic unit (ALU) and logic gates configured to support operation of the processing circuitry.

In an example embodiment, the apparatus includes means, such as the processing circuitry 42 or the like, configured to control the first and second switches 16, 18 so as to be controllably and alternately positioned in the first position or in the second position. In an example embodiment, the apparatus also includes means, such as the processing circuitry or the like, to control the other switches of the capacitance-to-digital converter 10, such as the third, fourth, fifth and sixth switches 28, 30, 22 and 32 as described below. In an example embodiment, the apparatus also includes means, such as the processing circuitry or the like, configured to determine a measure of the value measured by the second capacitor 14 with the measure of the value being determined in different manners depending upon the position of the first and second switches. In this regard, the apparatus, such as the processing circuitry, is configured to determine and measure the value based upon a ratio of the charge stored by the second capacitor to the charge stored by the first capacitor 12 in an instance in which the first and second switches are in the first position. Conversely, the apparatus, such as the processing circuitry, of this example embodiment is also configured to determine and measure the value based upon a ratio of the charge stored by the first capacitor to the charge stored by the second capacitor in an instance in which the first and second switches are in the second position.

In an example embodiment, the apparatus, such as the processing circuitry 42, is also configured to embody the saturation detector 34. In this regard, the saturation detector, such as may be embodied by the apparatus and, more particularly, by the processing circuitry, is configured to detect saturation of the capacitance-to-digital converter 10 and, in response, to reposition the first and second switches 16, 18. For example, in an instance in which the first and second switches are in the first position as shown in FIG. 1, the saturation detector, such as the apparatus, and, more particularly, the processing circuitry, is configured to detect the charge stored by the second capacitor equaling or exceeding the charge stored by the first capacitor in order to detect saturation of the amplifier 20 and, in response to detecting the charge stored by the second capacitor equaling or exceeding the charge stored by the first capacitor, causing the first and second switches to switch to the second position while continuing to measure the value with the charge stored by the second capacitor 14. Alternatively, in an instance in which the first and second switches are in the second position as shown in dashed lines in FIG. 1, the saturation detector, such as the apparatus, and, more particularly, the processing circuitry, is configured to detect the charge stored by the first capacitor equaling or exceeding the charge stored by the second capacitor in order to detect saturation of the amplifier 20 and, in response to detecting the charge stored by the first capacitor equaling or exceeding the charge stored by the second capacitor, causing the first and second switches to switch to the first position while continuing to measure the value with the charge stored by the second capacitor.

In an alternative embodiment, the saturation detector 34 is embodied, not by the processing circuitry 42, but by a hardware implementation. Although the hardware implementation of the saturation detector may be embodied in various manners, the hardware implementation of an example embodiment is depicted in FIG. 3 and includes a sample and hold circuit 50. The sample and hold circuit receives the output of the amplifier 20 and, in one embodiment, the output of the latch, such as the flip flop 26. The sample and hold circuit is clocked by a switch, such as a sixth switch 32 (also designated as SW6 in FIGS. 1 and 3). The sample and hold circuit is associated with a delay circuit 54 that is configured to delay the value provided by the sample and hold circuit by a single cycle of the same switch, such as the sixth switch, in an instance in which the sample and hold circuit receives the output of the amplifier 20, or by a time period much longer than a single cycle of the sixth switch, in an instance in which the sample and hold circuit receives the output of the flip flop 26. The outputs of the sample and hold circuit 50 and the delay circuit 54, such as the difference between the outputs of the sample and hold circuit and the delay circuit as determined by the differentiator 55, are then compared, such as by a window comparator 56. As a result of the delay introduced to the output of the sample and hold circuit, the window comparator is configured to compare the output of the amplifier from two different, such as two sequential, clock cycles, such as defined in the embodiment of FIG. 3 by the sixth switch. The hardware implementation of the saturation detector of this example embodiment may also include a latch 58, such as a flip flop and, more particularly, a T flip flop, configured to at least temporarily store or maintain the output of the window detector. By way of example, but not of limitation, latch 58 will also be hereinafter described in conjunction with an example embodiment in which the latch is a flip flop. However, the latch may be differently implemented in other embodiments.

The capacitance-to-digital converter 10 may be configured to define saturation in various manners. In an example embodiment, the capacitance-to-digital converter, such as the saturation detector 34, the processing circuitry 42 or the like, is configured to define saturation in an instance in which the output of the capacitance-to-digital converter, such as the output of the amplifier 20, remains the same value for at least two clock cycles, that is, clock cycles as defined by the sixth switch 32. Alternatively, the capacitance-to-digital converter, such as the saturation detector, the processing circuitry or the like, may define saturation in an instance in which the digital signal provided by the latch, such as the flip flop 26, has a predefined value throughout the measurement period of N clock cycles, as discussed below.

The operation of a capacitance-to-digital converter 10 in accordance with an example embodiment is now described in conjunction with FIG. 4. As shown in block 60 of FIG. 4, the capacitance-to-digital converter includes means, such as the saturation detector 32, the processing circuitry 42 or the like, for determining the position of the first and second switches 16, 18. As shown in FIG. 2, for example, the saturation detector may be configured to provide a position indicator signal indicative of the position of the first and second switches.

In an instance in which the first and second switches 16, 18 are in the first position, the capacitance-to-digital converter 10 includes means, such as the first and second capacitors 12, 14, for storing charge while the first and second switches are controlled by the processing circuitry 42 so as to be in the first position in order to connect the first and second capacitors, respectively, with a reference voltage Vref. See block 62. While the first and second switches remain in the first position, the capacitance-to-digital converter includes means, such as the second capacitor, for measuring a change in a value, such as a physical value, with a corresponding change in charge stored by the second capacitor. See block 64. Also while the first and second switches remain in the first position, the capacitance-to-digital converter includes means, such as the saturation detector 34 or the like, for detecting saturation of the capacitance-to-digital converter, such as in an instance in which the charge stored by the second capacitor equals or exceeds the charge stored by the first capacitor. See decision block 68. The capacitance-to-digital converter also includes means, such as the processing circuitry 42 or the like, for causing the first and second switches to switch to a second position while continuing to measure the change in the value with the charge stored by the second capacitor in response to detecting the charge stored by the second capacitor having equaled or exceeded the charge stored by the first capacitor. See block 70.

After optionally confirming that the value should still be measured as shown in decision block 72, the foregoing process repeats while the first and second switches 16, 18 are in the second position. In this regard, the capacitance-to-digital converter 10 includes means, such as the first and second capacitors 12, 14, for storing charge while the first and second switches are controlled by the processing circuitry 42 so as to be in the second position in order to connect the first and second capacitors, respectively, with a reference voltage Vref. See block 74. While the first and second switches remain in the second position, the capacitance-to-digital converter includes means, such as the second capacitor, for measuring a change in a value, such as a physical value, with a corresponding change in charge stored by the second capacitor. See block 76. Also while the first and second switches remain in the second position, the capacitance-to-digital converter includes means, such as the saturation detector 34, the processing circuitry or the like, for detecting saturation of the capacitance-to-digital converter, such as in an instance in which the charge stored by the first capacitor equals or exceeds the charge stored by the second capacitor. See decision block 80. The capacitance-to-digital converter also includes means, such as the processing circuitry or the like, for causing the first and second switches to switch to a first position while continuing to measure the change in the value with the charge stored by the second capacitor in response to detecting the charge stored by the first capacitor having equaled or exceeded the charge stored by the second capacitor. See block 82. As before, after optionally confirming that the value should still be measured as shown in decision block 84, the foregoing process repeats as described above in conjunction with blocks 62-70 while the first and second switches are in the first position.

As noted above, the first and second capacitors 12, 14 are switchably connected to the reference voltage Vref. In this regard, while the first and second switches are in the first position, the capacitance-to-digital converter 10 includes means, such as the processing circuitry 42 or the like, for controlling third and fourth switches 28, 30 switchably connecting the first capacitor to the reference voltage with a third switch and switchably connecting the second capacitor to the reference voltage with a fourth switch. However, while the first and second switches are in the second position, the capacitance-to-digital converter of this example embodiment includes means, such as the processing circuitry or the like, for controlling the third and fourth switches in order to switchably connect the second capacitor to the reference voltage with the third switch and switchably connect the first capacitor to the reference voltage with the fourth switch, thereby reversing the manner in which the first and second capacitors are connected to the reference voltage.

The capacitance-to-digital converter 10 of an example embodiment also includes means, such as the processing circuitry 42 or the like, for differently determining the measure of the value depending upon whether the first and second switches 16, 18 are in the first or second position, such as defined by the output of the saturation detector 34 which, in the illustrated embodiment, controls the positon of the first and second switches. In an example embodiment, the capacitance-to-digital converter includes means, such as the processing circuitry or the like, for determining the measure of a value based upon a ratio of the charge stored by the second capacitor 14 to the charge stored by the first capacitor 12 in an instance in which the first and second switches are controlled, such as by the processing circuitry, so as to be in the first position. See block 66 of FIG. 4. In regards to the embodiment of the capacitance-to-digital converter of FIG. 1, the mean value of the output of the latch, such as the flip flop 26, represents and, in one embodiment, equals the ratio of the charge stored by the second capacitor to the charge stored by the first capacitor in an instance in which the first and second switches are in the first position. By way of further example while the first and second switches are in the first position, the ratio of the capacitance of the second capacitor to the capacitance of the first capacitor may be defined as a ratio of n/N in which n is defined as the number of cycles from among the N total measurement cycles for which the output of the flip flop has a first value, such as a logical 1. Based upon the ratio of the capacitance of the second capacitor to the capacitance of the first capacitor, the value, such as the physical value, the capacitance-to-digital converter, such as the processing circuitry, is configured to determine the value measured by the second capacitor.

The capacitance-to-digital converter 10 of this example embodiment also includes means, such as the processing circuitry 42 or the like, for determining the measure of the value based upon a ratio of the charge stored by the first capacitor 12 to the charge stored by the second capacitor 14 in an instance in which the first and second switches 16, 18 are controlled, such as by the processing circuitry, so as to be in the second position. See block 78. In regards to the embodiment of the capacitance-to-digital converter of FIG. 1, the mean value of the output of the latch, such as the flip flop 26, represents and, in one embodiment, equals the ratio of the charge stored by the first capacitor to the charge stored by the second capacitor in an instance in which the first and second switches are in the second position such that the capacitance-to-digital converter, such as the processing circuitry, is capable of determining a measure of the value in the manner described above.

By way of further explanation, FIGS. 5-8 depict waveforms associated with a plurality of switches, such as the third, fourth, fifth and sixth switches 28, 30, 22, 32, as well as the output voltage of the amplifier 20 and the output of the latch, such as the flip flop 26. As shown in FIG. 5 in which the capacitance of the first and second capacitors 12, 14 is defined to be $Cs=Cr/4$, the sixth switch alternates between a logical one and a logical zero and, in the illustrated embodiment, has a duty cycle of 50%. As shown in the example embodiment of FIG. 1, the sixth switch serves as the clock to the flip flop and the saturation detector 34 and also switchably connects the first and second capacitors to ground. Relative to the sixth switch, the position of the third, fourth and fifth switches of the embodiment of the capacitance-to-digital converter of FIG. 1 are also illustrated in FIG. 5. As shown, each of these switches have a smaller duty cycle than that of the sixth switch. Notwithstanding the smaller duty cycle, the waveform of the fourth switch generally corresponds to the waveform of the sixth switch with both the fourth and sixth switches providing a logical 1 and a logical 0 during the same general time periods, while the third and fifth switches generally provide the opposite value from that provided by the fourth switch with the fifth switch, which switchably connects the first and second capacitors to the amplifier 20, having an even smaller duty cycle than that of the third switch.

As indicated above, the fourth switch 30 serves to switchably connect the second capacitor 14 to the reference voltage Vref in an instance in which the second switch 18 is in the first position and serves to switchably connect the first capacitor 12 to the reference voltage in an instance in which the first switch 16 is in the second position. The third switch 28 serves to switchably connect the first capacitor to the reference voltage in an instance in which the first switch is in the first position and serves to connect the second capacitor to the reference voltage in an instance in which the second switch is in the second position. In addition, the third and fourth switches serve to switchably connect a respective circuit paths from the reference voltage Vref to the amplifier 20 to ground.

As a result of the third and fourth switches 28, 30 being closed so as to have a value of logical 1 during different periods of the clock cycle, the first and second capacitors 12, 14 may be alternately connected to the reference voltage. Thus, in an instance in which the fourth switch is closed (logical 1) and the third switch is open (logical 0) and in which the first and second switches 16, 18 are in the first position, the second capacitor 14 is connected via the second and fourth switches to the reference voltage while the first capacitor 12 is switchably connected through first and fourth switches to ground. Conversely, in an instance in which the third switch is closed (logical 1) and the fourth switch is open (logical 0) and in which the first and second switches remain in the first position, the second capacitor is connected via the second and third switches to ground while the first capacitor is switchably connected through first and third switches to the reference voltage.

In the example embodiment of FIG. 5 in which the first and second switches 16, 18 are in the first position and in which the ratio of the charge stored by the first capacitor 12 to the charge stored by the second capacitor is defined as $Cs=Cr/4$, the amplifier 20 is switchably connected to the first and second capacitors by the fifth switch 22, which serves to define the charging phase of the second capacitor in an instance in which the fifth switch is open (such that the second capacitor is charged to the reference voltage) and the first capacitor is short circuited as a result of the fourth and sixth switches being closed (logical 1) and the third switch being open (logical 0) and a discharging phase of the second capacitor in an instance in which the fifth switch is closed (and the charge stored by the second capacitor is transferred to the amplifier, such as the feedback capacitor 24, as a result of the fourth and sixth switches being open (logical 0) and the third switch being closed (logical 1). As shown, in an instance in which the output voltage of the amplifier is positive at the time at which the fifth switch closes, the output voltage decreases by an amount that is dependent upon the difference in charged stored by the first and second capacitors, such as by decreasing by an amount equal to $(Cs-Cr)Vref/Ci$ in which Ci is the capacitance stored by the feedback capacitor. In an example embodiment, the feedback capacitor of the amplifier is charged by a charge equal to the charge stored by the first capacitor (which was charged to the reference voltage Vref) while the feedback capacitor is concurrently discharged by the second capacitor such that the resulting amplifier output voltage change is equal to $(Cs-Cr)Vref/Ci$. Thereafter, during each clock cycle of the third switch while the output voltage of the amplifier is negative, the output voltage of the amplifier increases by an amount that is dependent upon the charge stored by the second capacitor, such as by increasing by an amount equal to $CsVref/Ci$. Once the output of the amplifier again becomes positive, the process of decreasing the output voltage and then incrementally increasing the output voltage is repeated. FIG. 5 also depicts the output waveform Vsd of the latch, such as the flip flop 26. In this regard, the flip flop is clocked by the sixth switch 32 and has a first value (logical 1) during each clock cycle of sixth switch in which the output voltage of the amplifier is initially positive and has an output value of zero (logical 0) during each clock cycle of the sixth switch in which the output voltage of the amplifier has an initial voltage that is negative. With reference to FIG. 5, the ratio of the capacitance of the second capacitor to the capacitance of the first capacitor is equal to the ratio of n/N in which n is the number of clock cycles in which the output of the flip flop has a first value (logical 1) relative to the total number of clock cycles in a measurement period. In this regard, n=1 and N=4 in the example embodiment of FIG. 5.

By way of another example, FIG. 6 depicts the waveforms in an instance in which the ratio of the capacitance of the second capacitor 14 to the capacitance of the first capacitor 12 is defined as Cs/Cr=3/4. In the illustrated embodiment, the output voltage of the amplifier 20 is decreased by an amount equal to the (Cs−Cr)Vref/Ci repeatedly for each of three clock cycles until the output voltage of the amplifier has a negative value, at which time the capacitance-to-digital converter 10 causes the output voltage of the amplifier to increase by an amount equal to CsVref/Ci. As indicated by the output voltage of the latch, such as the flip flop 26, the output voltage of the amplifier is positive for three of the four clock cycles of the measurement cycle such that the ratio of the capacitance of the second capacitor to the capacitance of the first capacitor is equal to ¾, e.g., n=3 and N=4.

While the waveforms of FIGS. 5 and 6 have illustrated the operation of the capacitance-to-digital converter 10 in instances in which the capacitance-to-digital converter was not saturated and the capacitance-to-digital converter was capable of measuring the charge stored by the second capacitor 14 and, as a result, a measure of the value monitored by the capacitance-to-digital converter, the waveforms of FIG. 7 illustrate a situation in which the capacitance-to-digital converter is saturated in that the output of the amplifier remains at a high value for all clock cycles of the measurement cycle and, correspondingly, the output of the latch, such as the flip flop 26, remains high during all clock cycles. As a result of its saturation, a conventional capacitance-to-digital converter is unable to accurately measure the charge stored by the second capacitor and, as a result, the value monitored by the capacitance-to-digital converter.

In accordance with an example embodiment, however, the capacitance-to-digital converter 10 repositions the first and second switches 16, 18 between the first and second positions upon detecting the saturation of the capacitance-to-digital converter with the operation of the capacitance-to-digital converter depicted in FIG. 8 following the repositioning of the first and second switches to the second position and in an instance in which the capacitance of the first capacitor 12 to the capacitance of the second capacitor 14 defines a ratio of Cr/Cs=3/4. As shown in FIG. 8, the output of the latch, such as the flip flop 26, is switched by the sixth switch 32 and has a value of logical 1 in an instance in which the output value of the amplifier 20 is positive when the sixth switch is closed and has a value of logical 0 in an instance in which the output of the amplifier has a negative value when the sixth switch is closed. Additionally, the output voltage of the amplifier is reduced, such as by an amount equal to (Cr−Cs)Vref/Ci, in an instance in which the output voltage is positive at the time at which the fifth switch 22 is closed and is increased by an amount, such as by CrVref/Ci, in an instance in which the output voltage is negative when the fifth switch is closed. By switching the position of the first and second switches when the capacitance-to-digital converter is saturated, the measurement range of the capacitance-to-digital converter may correspondingly be extended, such as by being doubled, as indicated by FIG. 8 which illustrates the continued measurement of the value following saturation as a result of having switched the electrical connection of the first and second capacitors to the reference voltage.

By way of example, FIG. 9A depicts the output of the amplifier of a conventional sigma-delta based capacitance-to-digital converter with a dotted line and the output of the flip flop of a conventional capacitance-to-digital converter with a solid line in instances in which the reference capacitor has a value of 36 pF, while the sensing capacitor has values of 16 pF and 54 pF for the upper and lower graphs, respectively. In an instance in which the sensing capacitor has a value of 16 pF, the upper graph of FIG. 9A illustrates that the capacitance-to-digital converter operates as intended such that the ratio of the number n of periods during which the output of the flip flop has a logical 1 to the total number N of measurement periods is indicative of the charge stored by the sensing capacitor and, as a result, a measure of the value. However, in instances in which the sensing capacitor has a value of 54 pF, the capacitance-to-digital converter is saturated and is unable to measure the value.

In comparison, FIG. 9B depicts the output of the amplifier with a dotted line and the output of the latch, such as a flip flop, with a solid line of a capacitance-to-digital converter 10 of an example embodiment in instances in which the first capacitor 12, that is, the reference capacitor, has a value of 36 pF, while the second capacitor, that is, the sensing capacitor, has values of 16 pF and 54 pF for the upper and lower graphs, respectively. In the upper graph, the capacitance-to-digital converter performs in the same fashion as a conventional sigma-delta based capacitance-to-digital converter as shown in the upper graph of FIG. 9A since the conventional sigma-delta based capacitance-to-digital converter is not saturated. Notably, however, a capacitance-to-digital converter having a second capacitor, that is, a sensing capacitor, of 54 pF in accordance with an example embodiment does not saturate in the manner shown in FIG. 9A in conjunction with a conventional sigma-delta based capacitance-to-digital converter, but instead continues to monitor the charge stored by the second capacitor 14, that is, the sensing capacitor. As a result, the capacitance-to-digital converter of an example embodiment continues to measure the value, such as the physical value, that is being monitored as a result of repeatedly switching the connection of the first and second capacitors to the reference voltage and correspondingly redefining the ratio for the first and second capacitances that, in turn, defines the measure of the value being monitored.

As a result, the measurement range of the capacitance-to-digital converter 10 of an example embodiment is extended while maintaining the relatively high resolution and linearity of the capacitance-to-digital converter, thereby permitting improved performance and/or utilization in additional applications that demand a broader measurement range. Additionally or alternatively, the capacitance-to-digital converter of an example embodiment may continue to provide the same measurement range, but may permit the value of the first capacitor 12, that is, the reference capacitor, to be reduced, such as by reducing the value of the first capacitor by 50%, thereby correspondingly reducing the area or volume within the integrated circuit consumed by the reference capacitor and potentially decreasing the size and/or the cost of the integrated circuit that embodies the capacitance-to-digital converter of an example embodiment.

FIG. 4 illustrates a flowchart depicting a method according to an example embodiment of the present invention. It will be understood that each block of the flowchart and combination of blocks in the flowchart may be implemented by various means, such as hardware, firmware, processor, circuitry, and/or other communication devices associated with execution of software including one or more computer program instructions. For example, one or more of the procedures described above may be embodied by computer program instructions. In this regard, the computer program instructions which embody the procedures described above may be stored by a memory device 44 of an apparatus employing an embodiment of the present invention and executed by a processing circuitry 42. As will be appreciated, any such computer program instructions may be loaded onto a computer or other programmable apparatus (for example, hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart blocks.

Accordingly, blocks of the flowchart support combinations of means for performing the specified functions and combinations of operations for performing the specified functions for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims.

Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed is:

1. A capacitance-to-digital converter comprising:
   first and second capacitors, wherein the second capacitor is configured to measure a change in charge stored by the second capacitor, wherein the change in charge is representative of a corresponding change in a value;
   first and second switches switchably connecting the first and second capacitors, respectively, to a reference voltage while the first and second switches are in a first position such that charge is stored by the first and second capacitors in response to the reference voltage; and
   a saturation detector configured to detect the charge stored by the second capacitor equaling or exceeding the charge stored by the first capacitor and, in response to detecting the charge stored by the second capacitor equaling or exceeding the charge stored by the first capacitor, causing the first and second switches to switch to a second position while continuing to measure the change in the value with the charge stored by the second capacitor.

2. The capacitance-to-digital converter according to claim 1 further comprising a processor configured to differently determine a measure of the value depending upon whether the first and second switches are in the first or second position.

3. The capacitance-to-digital converter according to claim 1 further comprising a processor configured to:
   determine a measure of the value based upon a ratio of the charge stored by the second capacitor to the charge stored by the first capacitor in an instance in which the first and second switches are in the first position; and
   determine the measure of the value based upon a ratio of the charge stored by the first capacitor to the charge stored by the second capacitor in an instance in which the first and second switches are in the second position.

4. The capacitance-to-digital converter according to claim 1 wherein the saturation detector is configured to:
   detect, while the first and second switches are in the second position, the charge stored by the first capacitor equaling or exceeding the charge stored by the second capacitor; and
   in response to detecting the charge stored by the first capacitor equaling or exceeding the charge stored by the second capacitor, cause the first and second switches to switch to the first position while continuing to measure the change in the charge stored by the second capacitor as representative of the corresponding change in the value.

5. The capacitance-to-digital converter according to claim 1 wherein the saturation detector is configured to detect an output of the capacitance-to-digital converter being in saturation in response to the charge stored by the second capacitor equaling or exceeding the charge stored by the first capacitor.

6. The capacitance-to-digital converter according to claim 1 further comprising third and fourth switches, wherein the third and fourth switches are configured to:
   while the first and second switches are in the first position, switchably connect the first capacitor to the reference voltage with the third switch and switchably connect the second capacitor to the input voltage with the fourth switch; and
   while the first and second switches are in the second position, switchably connect the second capacitor to the reference voltage with the third switch and switchably connect the first capacitor to the input voltage with the fourth switch.

7. The capacitance-to-digital converter according to claim 6 further comprising an amplifier to which the first and second capacitors are switchably connected such that, while an output of the amplifier is negative, the output of the amplifier is increased based upon the charge stored by a respective one of the first and second capacitors that is connected to the reference voltage by the fourth switch and independent of the charge stored by a respective one of the first and second capacitors that is connected to the reference voltage by the third switch and, while the output of the amplifier is positive, the output of the amplifier is decreased based upon a difference between the charges stored by the first and second capacitors.

8. The capacitance-to-digital converter according to claim 7 further comprising:
a latch circuit configured to generate the output of the capacitance-to-digital converter in the form of a digital signal based upon the output of the amplifier; and
a processor configured to determine a measure of the value based upon a ratio of a number of clock cycles having a predefined value to a total number of clock cycles within a measurement period.

9. The capacitance-to-digital converter according to claim 8 wherein the saturation detector is configured to detect the output of the capacitance-to-digital converter being in saturation in an instance in which the digital signal has the predefined value throughout the measurement period.

10. A method comprising:
storing charge with first and second capacitors of a capacitance-to-digital converter while first and second switches are in a first position so as to connect the first and second capacitors, respectively, with a reference voltage;
measuring a change in charge stored by the second capacitor, wherein the change in charge is representative of a corresponding change in a value;
detecting the charge stored by the second capacitor equaling or exceeding the charge stored by the first capacitor; and
in response to detecting the charge stored by the second capacitor equaling or exceeding the charge stored by the first capacitor, causing the first and second switches to switch to a second position while continuing to measure the change in the charge stored by the second capacitor as representative of the corresponding change in the value.

11. The method according to claim 10 further comprising differently determining a measure of the value depending upon whether the first and second switches are in the first or second position.

12. The method according to claim 11 wherein differently determining the measure of the value comprises:
determining the measure of the value based upon a ratio of the charge stored by the second capacitor to the charge stored by the first capacitor in an instance in which the first and second switches are in the first position; and
determining the measure of the value based upon a ratio of the charge stored by the first capacitor to the charge stored by the second capacitor in an instance in which the first and second switches are in the second position.

13. The method according to claim 10 further comprising:
while the first and second switches are in the second position, detecting the charge stored by the first capacitor equaling or exceeding the charge stored by the second capacitor; and
in response to detecting the charge stored by the first capacitor equaling or exceeding the charge stored by the second capacitor, causing the first and second switches to switch to the first position while continuing to measure the change in the charge stored by the second capacitor as representative of the corresponding change in the value.

14. The method according to claim 10 wherein detecting the charge stored by the second capacitor equaling or exceeding the charge stored by the first capacitor comprises detecting an output of the capacitance-to-digital converter being in saturation.

15. The method according to claim 10 further comprising:
while the first and second switches are in the first position, switchably connecting the first capacitor to the reference voltage with a third switch and switchably connecting the second capacitor to the reference voltage with a fourth switch; and
while the first and second switches are in the second position, switchably connecting the second capacitor to the reference voltage with the third switch and switchably connecting the first capacitor to the reference voltage with the fourth switch.

16. The method according to claim 10 further comprising switchably connecting the first and second capacitors to an amplifier such that, while an output of the amplifier is negative, the output of the amplifier is increased based upon the charge stored by a respective one of the first and second capacitors that is connected to the reference voltage by the fourth switch and independent of the charge stored by a respective one of the first and second capacitors that is connected to the reference voltage by the third switch and, while the output of the amplifier is positive, the output of the amplifier is decreased based upon a difference between the charges stored by the first and second capacitors.

17. The method according to claim 16 further comprising generating the output of the capacitance-to-digital converter in the form of a digital signal based upon the output of the amplifier; and determining a measure of the value based upon a ratio of a number of clock cycles having a predefined value to a total number of clock cycles within a measurement period.

18. The method according to claim 17 wherein detecting the charge stored by the second capacitor equaling or exceeding the charge stored by the first capacitor comprises detecting the output of the capacitance-to-digital converter being in saturation in an instance in which the digital signal has the predefined value throughout the measurement period.

19. A computer program product configured to control a capacitance-to-digital converter comprising first and second capacitors switchably connected to a reference voltage with first and second switches, respectively, that are in a first position, wherein the second capacitor is configured to measure a change in a value with a corresponding change in charge stored by the second capacitor, and wherein the capacitance-to-digital converter further comprises a saturation detector configured to detect a charge stored by the second capacitor equaling or exceeding a charge stored by the first capacitor, the computer program product comprising at least one non-transitory computer-readable storage medium having computer-executable program code instructions stored therein, the computer-executable program code instructions comprising program code instructions configured to:
control the first and second switches to switch to a second position, different than the first position, in response to detecting that the charge stored by the second capacitor equals or exceeds the charge stored by the first capacitor.

20. The computer program product according to claim 19 wherein the computer-executable program code instructions further comprise program code instructions configured to:
determine a measure of the value based upon a ratio of the charge stored by the second capacitor to the charge stored by the first capacitor in an instance in which the first and second switches are in the first position; and determine the measure of the value based upon a ratio of the charge stored by the first capacitor to the charge stored by the second capacitor in an instance in which the first and second switches are in the second position.

* * * * *